United States Patent
Chen et al.

(10) Patent No.: US 11,342,256 B2
(45) Date of Patent: May 24, 2022

(54) METHOD OF FINE REDISTRIBUTION INTERCONNECT FORMATION FOR ADVANCED PACKAGING APPLICATIONS

(71) Applicant: Applied Materials, Inc., Santa Clara, CA (US)

(72) Inventors: Han-Wen Chen, Cupertino, CA (US); Steven Verhaverbeke, San Francisco, CA (US); Kyuil Cho, Santa Clara, CA (US); Prayudi Lianto, Singapore (SG); Guan Huei See, Singapore (SG); Vincent Dicaprio, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/256,809

(22) Filed: Jan. 24, 2019

(65) Prior Publication Data
US 2020/0243432 A1 Jul. 30, 2020

(51) Int. Cl.
*H01L 23/498* (2006.01)
*H01L 23/14* (2006.01)
*H01L 21/48* (2006.01)

(52) U.S. Cl.
CPC .... *H01L 23/49838* (2013.01); *H01L 21/4846* (2013.01); *H01L 23/145* (2013.01); *H01L 23/49866* (2013.01)

(58) Field of Classification Search
CPC ........ H05K 1/115; H05K 3/42; H05K 3/4007; H05K 3/4038; H05K 3/421; H05K 3/423; H05K 3/424; Y10T 29/49165; Y10T 29/49204; Y10T 29/49224

USPC .................. 29/852, 846, 874, 885
See application file for complete search history.

(56) References Cited

U.S. PATENT DOCUMENTS

| 4,073,610 | A |   | 2/1978  | Cox |
|-----------|---|---|---------|-----|
| 5,126,016 | A | * | 6/1992  | Glenning ............ H01L 21/4846 205/125 |
| 5,268,194 | A |   | 12/1993 | Kawakami et al. |
| 5,353,195 | A |   | 10/1994 | Fillion et al. |
| 5,374,788 | A |   | 12/1994 | Endoh et al. |
| 5,474,834 | A |   | 12/1995 | Tanahashi et al. |
| 5,670,262 | A | * | 9/1997  | Dalman ................. C09J 179/04 428/458 |
| 5,767,480 | A |   | 6/1998  | Anglin et al. |
| 5,783,870 | A |   | 7/1998  | Mostafazadeh et al. |

(Continued)

FOREIGN PATENT DOCUMENTS

| CA | 2481616 C | 1/2013 |
|----|-----------|--------|
| CN | 1971894 A | 5/2007 |

(Continued)

OTHER PUBLICATIONS

Lee et al. "Effect of sputtering parameters on the adhesion force of copper/molybdenum metal on polymer substrate," 2011, Current Applied Physics, vol. 11, pp. S12-S15, doi: 10 1016/j.cap.2011.06.019.

(Continued)

*Primary Examiner* — Minh N Trinh
(74) *Attorney, Agent, or Firm* — Patterson & Sheridan, LLP

(57) ABSTRACT

A method for producing an electrical component is disclosed using a molybdenum adhesion layer, connecting a polyimide substrate to a copper seed layer and copper plated attachment.

18 Claims, 5 Drawing Sheets

(56) References Cited

U.S. PATENT DOCUMENTS

| | | |
|---|---|---|
| 5,841,102 A | 11/1998 | Noddin |
| 5,878,485 A | 3/1999 | Wood et al. |
| 6,039,889 A * | 3/2000 | Zhang ............... H05K 3/0038 216/13 |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 * | 8/2004 | Boyko ............... H05K 3/108 29/846 |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 * | 10/2007 | Shimoishizaka ... H01L 23/3114 438/107 |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |

(56) References Cited

U.S. PATENT DOCUMENTS

| | | |
|---|---|---|
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0283716 A1 | 12/2006 | Hafezi et al. |
| 2007/0035033 A1 | 2/2007 | Ozguz et al. |
| 2007/0077865 A1 | 4/2007 | Dysard et al. |
| 2007/0111401 A1 | 5/2007 | Kataoka et al. |
| 2007/0130761 A1* | 6/2007 | Kang ............... H05K 1/116 29/830 |
| 2008/0006945 A1 | 1/2008 | Lin et al. |
| 2008/0011852 A1 | 1/2008 | Gu et al. |
| 2008/0090095 A1* | 4/2008 | Nagata ............... C23C 28/021 428/626 |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0243065 A1 | 10/2009 | Sugino et al. |
| 2009/0250823 A1 | 10/2009 | Racz et al. |
| 2009/0278126 A1* | 11/2009 | Yang ............... H01L 27/124 257/57 |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1* | 6/2010 | Yun ............... H01L 23/5223 257/532 |
| 2010/0160170 A1 | 6/2010 | Horimoto et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0291293 A1 | 12/2011 | Tuominen et al. |
| 2011/0316147 A1 | 12/2011 | Shih et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0105329 A1* | 5/2013 | Matejat ............... H01L 24/13 205/125 |
| 2013/0286615 A1 | 10/2013 | Inagaki et al. |
| 2014/0054075 A1* | 2/2014 | Hu ............... H05K 3/3452 174/257 |
| 2014/0092519 A1* | 4/2014 | Yang ............... G06F 3/0446 361/220 |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2015/0228416 A1 | 8/2015 | Hurwitz et al. |
| 2015/0296610 A1* | 10/2015 | Daghighian ............. H05K 1/032 385/14 |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0020163 A1 | 1/2016 | Shimizu et al. |
| 2016/0049371 A1 | 2/2016 | Lee et al. |
| 2016/0095203 A1 | 3/2016 | Min et al. |
| 2016/0270242 A1* | 9/2016 | Kim ..................... H05K 1/0353 |
| 2016/0336296 A1 | 11/2016 | Jeong et al. |
| 2017/0223842 A1 | 8/2017 | Chujo et al. |
| 2017/0229432 A1 | 8/2017 | Lin et al. |
| 2017/0338254 A1* | 11/2017 | Reit ..................... H01L 29/7869 |
| 2018/0116057 A1 | 4/2018 | Kajihara et al. |
| 2018/0182727 A1 | 6/2018 | Yu |
| 2018/0308792 A1 | 10/2018 | Raghunathan et al. |
| 2018/0352658 A1 | 12/2018 | Yang |
| 2018/0376589 A1 | 12/2018 | Harazono |
| 2019/0131224 A1 | 5/2019 | Choi et al. |
| 2019/0131270 A1 | 5/2019 | Lee et al. |
| 2019/0189561 A1 | 6/2019 | Rusli |
| 2019/0237430 A1 | 8/2019 | England |
| 2019/0285981 A1 | 9/2019 | Cunningham et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 108028225 A | 5/2018 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |

(56) References Cited

FOREIGN PATENT DOCUMENTS

| WO | 2019066988 A1 | 4/2019 |
|---|---|---|
| WO | 2019/177742 A1 | 9/2019 |

OTHER PUBLICATIONS

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

Yu et al. "High Performance, High Density RDL for Advanced Packaging," 2018 IEEE 68th Electronic Components and Technology Conference, pp. 587-593, DOI 10.1109/ETCC.2018.0009.

International Search Report and the Written Opinion for International Application No. PCT/US2019/064280 dated Mar. 20, 2020, 12 pages.

Taiwan Office Action dated Oct. 27, 2020 for Application No. 108148588.

Allresist Gmbh—Strausberg et al: "Resist-Wiki: Adhesion promoter HMDS and diphenylsilanedio (AR 300-80)—. . .—ALLRESIST GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].

Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).

Arifur Rahman. "System-Level Performance Evaluation of Three-Dimensional Integrated Circuits", vol. 8, No. 6, Dec. 2000 pp. 671-678.

Baier, T. et al., Theoretical Approach to Estimate Laser Process Parameters for Drilling in Crystalline Silicon, Prog. Photovolt: Res. Appl: 18 (2010) 603-606, 5 pages.

Chien-Wei Chien et al "Chip Embedded Wafer Level Packaging Technology for Stacked RF-SiP Application",2007 IEEE, pp. 305-310.

Chien-Wei Chien et al. "3D Chip Stack With Wafer Through Hole Technology". 6 pages.

Doany, F.E., et al.—"Laser release process to obtain freestanding multilayer metal-polyimide circuits," IBM Journal of Research and Development, vol. 41, Issue 1/2, Jan./Mar. 1997, pp. 151-157.

Dyer, P.E., et al.—"Nanosecond photoacoustic studies on ultraviolet laser ablation of organic polymers," Applied Physics Letters, vol. 48, No. 6, Feb. 10, 1986, pp. 445-447.

Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].

Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].

Han, Younggun, et al.—"Evaluation of Residual Stress and Warpage of Device Embedded Substrates with Piezo-Resistive Sensor Silicon Chips" technical paper, Jul. 31, 2015, pp. 81-94.

International Search Report and Written Opinion for Application No. PCT/US2020/026832 dated Jul. 23, 2020.

Italian search report and written opinion for Application No. IT 201900006736 dated Mar. 2, 2020.

Italian Search Report and Written Opinion for Application No. IT 201900006740 dated Mar. 4, 2020.

Junghoon Yeom', et al. "Critical Aspect Ratio Dependence in Deep Reactive Ion Etching of Silicon", 2003 IEEE. pp. 1631-1634.

K. Sakuma et al. "3D Stacking Technology with Low-Volume Lead-Free Interconnections", IBM T.J. Watson Research Center. 2007 IEEE, pp. 627-632.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

L. Wang, et al. "High aspect ratio through-wafer interconnections for 3Dmicrosystems", 2003 IEEE. pp. 634-637.

Liu, C.Y. et al., Time Resolved Shadowgraph Images of Silicon during Laser Ablation: Shockwaves and Particle Generation, Journal of Physics: Conference Series 59 (2007) 338-342, 6 pages.

Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373 380.

NT Nguyen et al. "Through-Wafer Copper Electroplating for Three-Dimensional Interconnects", Journal of Micromechanics and Microengineering. 12 (2002) 395-399. 2002 IOP.

PCT International Search Report and Written Opinion dated Aug. 28, 2020, for International Application No. PCT/US2020/032245.

PCT International Search Report and Written Opinion dated Sep. 15, 2020, for International Application No. PCT/US2020/035778.

Ronald Hon et al. "Multi-Stack Flip Chip 3D Packaging with Copper Plated Through-Silicon Vertical Interconnection", 2005 IEEE pp. 384-389.

S. W. Ricky Lee et al. "3D Stacked Flip Chip Packaging with Through Silicon Vias and Copper Plating or Conductive Adhesive Filling", 2005 IEEE, pp. 798-801.

Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.

Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.

Srinivasan, R., et al.—"Ultraviolet Laser Ablation of Organic Polymers," Chemical Reviews, 1989, vol. 89, No. 6, pp. 1303-1316.

Trusheim, D. et al., Investigation of the Influence of Pulse Duration in Laser Processes for Solar Cells, Physics Procedia Dec. 2011, 278-285, 9 pages.

Wu et al., Microelect. Eng., vol. 87 2010, pp. 505-509.

Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.

PCT International Search Report and Written Opinion dated Feb. 17, 2021 for International Application No. PCT/US2020/057787.

PCT International Search Report and Written Opinion dated Feb. 19, 2021, for International Application No. PCT/US2020/057788.

U.S. Office Action dated May 13, 2021, in U.S. Appl. No. 16/870,843.

Shen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.

Lannon, John Jr., et al.—"Fabrication and Testing of a TSV-Enabled Si Interposer with Cu- and Polymer-Based Multilevel Metalliza-

(56) References Cited

OTHER PUBLICATIONS tion," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 EEE International, Nov. 16-18, 2010, 6 pages.
Tecnisco, LTD.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.

\* cited by examiner

| ATTRIBUTES | SILICON INTERPOSER | EMBEDDED Cu TRACE | SAP Cu TRACE |
|---|---|---|---|
| TECHNOLOGY | BEOL | POLYMER WITH CONFORMAL SEED METAL | PR + POLYMER WITH BOTTOM SEED METAL |
| PLATFORM | WAFER | WAFER | WAFER |
| MAXIMUM ROUTING/mm (L/S: μm) | ~1300 (0.4/0.4) | ~330 (2/1) | ~500 (1/1) |
| COST | HIGH | LOW | LOW |
| RF INSERTION LOSS AT HIGH FREQUENCY | MEDIUM HIGH | LOW | MEDIUM HIGH |

FIG. 1

Via etching on Silicon

Dielectric layer deposition

Barrier/adhesion layer and seed layer deposition

Electroplating

Chemical mechanical polishing

Silicon back grinding/etching

Dielectric1 process

Dielectric2 process

Seed layer PVD

Cu ECP

Excess Cu overburden & seed layer Removal

RDL2 formation

Undercut w/ Ti due to required over-etch

Minimal undercut w/ Mo

METHOD OF FINE REDISTRIBUTION INTERCONNECT FORMATION FOR ADVANCED PACKAGING APPLICATIONS

BACKGROUND

Field

Embodiments of the present disclosure generally relate to packaging of electrical components. More specifically, aspects of the disclosure relate to fine redistribution techniques to establish interconnection between electronic components in packaging applications.

Description of the Related Art

As time progresses, the need for advanced packing of electronic components increases. Technology increases in areas such as microelectronics are used in a variety of applications, from smart phones, wearable devices, computers and other consumable electronics to automotive, transportation, energy, aerospace and defense. Going forward, with exponential growth of big data, evolution of the Internet of Things (IoT) and advancement in Artificial Intelligence (AI), there is an ever increasing need to provide more efficient microelectronics that produce needed results while being energy efficient and cost effective.

While conventional methods of packaging electronic components may be acceptable in one year, successive years require large increases in efficiency. As a non-limiting embodiment, die sizes for electronic components are based upon a resolution defined as line/space (L/S). Roadmaps of needed resolutions are decreasing from 25/25 µm for embedded die application to a much smaller 15/15 µm in panel-level packaging.

Resolutions for technologies other than embedded die construction are even more restrictive. For organic panel interposer technology, required resolution progresses from 10/10 µm to 2/2 µm in upcoming years. Resolution based technologies currently used are not capable of production of the electronic components of the future.

Currently, there are no cost-effective high-density redistribution line technologies for sub-micron line/space resolution in the packaging industry. While technologies do exist, such as redistribution layer technologies for silicon interposer and embedded copper trace technologies, these types of technologies are extremely cost inefficient and not applicable to large scale manufacturing.

Referring to FIG. 1, a comparison of redistribution line technologies is presented. For silicon interposer technologies, the applicable platform is a wafer platform and the maximum routing/millimeter is 1300 (L/S 0.4/0.4 µm). Cost of such silicon interposer technologies is higher and RF insertion loss at high frequency is relatively high.

Further referring to FIG. 1, embedded copper trace uses a polymer with a conformal seed material. Like the silicon interposer technology, the embedded copper trace technology can be used on a wafer and may achieve a maximum routing/millimeter of 300 (LS 2/1 µm). While the cost of embedded coper trace technology can be relatively low additional steps are involved in removing copper overburden and seed layer due to the dual damascene based process flow. Such increased number of steps hampers the overall time frames for production. Necessity of employing non-standard equipment in the packaging industry, i.e. chemical mechanical polishing (CMP) tool, for copper overburden and seed layer removal also limits the overall economic viability of this method.

For illustrated Semi-Additive Process (SAP) Cu trace technology, such methods are applicable to wafer technology and may achieve a maximum routing/millimeter of 500 (L/S 1/1 µm) with low cost. SAP Cu trace technology, however, has a significant drawback in having a high RF insertion loss at high frequency. Each of the major high density redistribution line technologies has at least one major drawback, hampering their use in the ever increasing need for high density packaging.

There is a need to provide technology that will provide for required resolution trends (line/space) of the future.

These technologies should be efficient for large scale production facilities as well as economic for production requirements of the future.

SUMMARY

In one example embodiment, a method for producing an electrical component is disclosed, comprising: providing a polyimide substrate, coating at least one side of the polyimide substrate with an adhesion layer comprising molybdenum, coating the adhesion layer with a copper seed layer, covering at least a portion of the copper seed layer with a coating of photoresist, removing a section of the coating of the photoresist to produce a surface feature, performing a copper plating process wherein the surface feature is filled with copper, removing the photoresist to produce a copper surface, performing a copper seed layer etching on the copper surface to produce copper etched surface and performing an adhesion layer etching on the copper etched surface.

In another example embodiment, a method for producing an electrical component is disclosed, comprising: providing a polyimide substrate with an adhesion layer containing molybdenum and a copper seed layer, covering at least a portion of the copper seed layer with a coating of photoresist, exposing the coating of photoresist, through a mask, to a radiation source, removing a section of the coating of the photoresist to produce a surface feature transferred from the mask, performing a copper plating process wherein the surface feature is filled with copper, removing the photoresist to produce a copper surface, performing a copper etching on the copper surface to produce copper etched surface and performing an adhesion layer etching on the copper etched surface.

In another example embodiment, an arrangement is disclosed, comprising: polyimide substrate with a first surface, a molybdenum adhesion layer connected to the first surface, a copper seed layer connected to the molybdenum adhesion layer; and a copper layer connected to the copper seed layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1 is a table of prior art high density redistribution line technologies and limitations of such technologies.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim. Likewise, reference to "the disclosure" shall not be construed as a generalization of an inventive subject matter disclosed herein and shall not be considered to be an element or limitation of the appended claims except where explicitly recited in a claim.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Figure 2A:
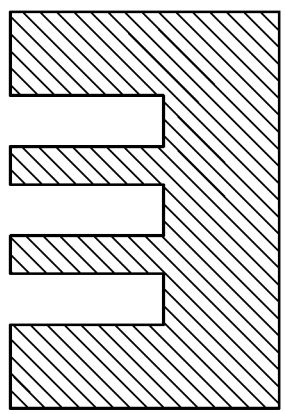
FIGS. 2A, 2B, 2C, 2D, 2E and 2F are a prior art process for silicon interposer technology.
Figure 2B:
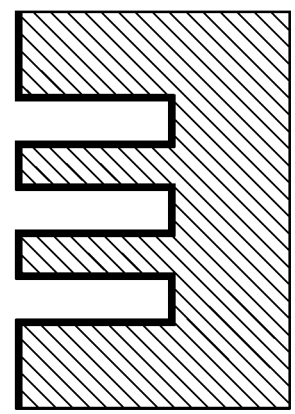
Figure 2C:
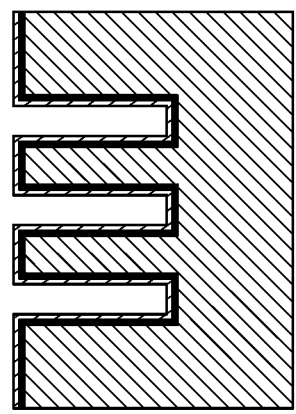
Figure 2D:
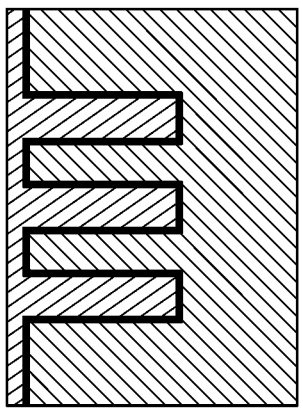
Figure 2E:
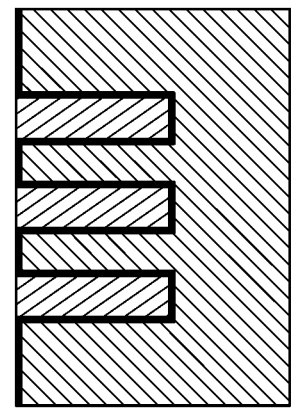
Figure 2F:
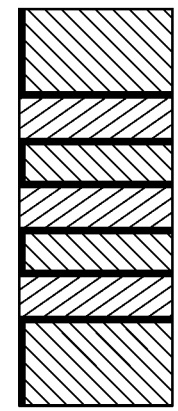

FIGS. 2A through 2F illustrate a prior art method for using silicon interposer technology. In FIG. 2A, a silicon wafer is present with etched features from a top side. In FIG. 2B, a dielectric fabrication step is performed, placing a dielectric over the top layer of the etched features of the wafer. In FIG. 2C, a barrier/adhesion layer and a seed layer are placed over the dielectric layer. In FIG. 2D, a step of electroplating occurs, filling the features remaining from the etched features. A layer of overfill from the electroplating also occurs. In FIG. 2E, removal of the excess layer of overfill occurs. Lastly, in FIG. 2F, mechanical methods, such as grinding, or etching may be used to remove the bottom layer of wafer, producing a final product. The slow silicon etch rate with common Bosch process by Deep Reactive Ion Etching (DRIE) and complexity of additional steps involved in insulating vias from the surrounding silicon, on top of the high capital expenditure on required equipment, result in costly fabrication, as listed in FIG. 1.

Figure 3A:
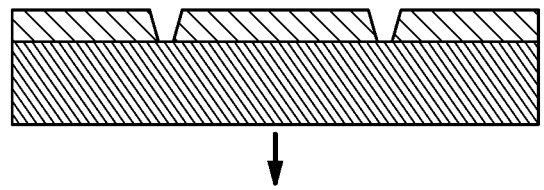
FIGS. 3A, 3B, 3C, 3D, 3E and 3F are a prior art process for embedded copper trace technology.
Figure 3B:
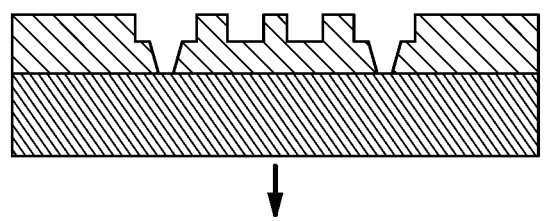
Figure 3C:
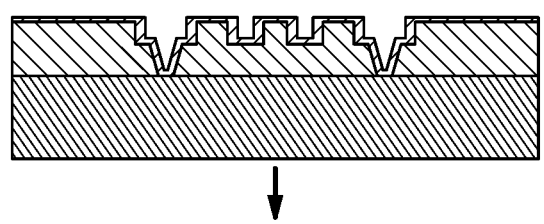
Figure 3D:
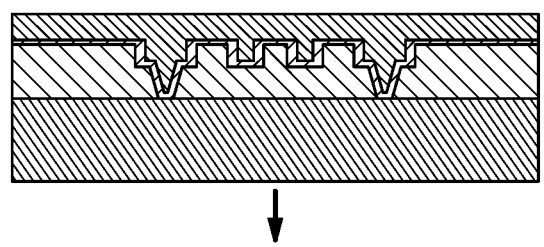
Figure 3E:
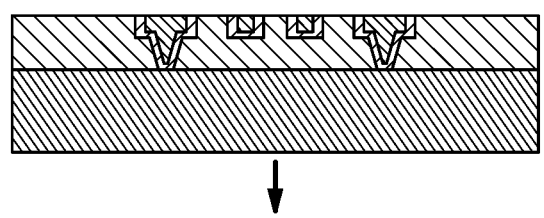
Figure 3F:
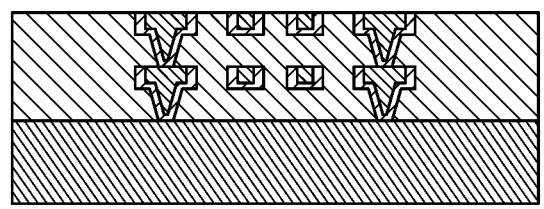

Referring to FIGS. 3A through 3F a prior art method for using embedded copper trace technology is illustrated. In FIG. 3A, a silicon wafer is presented with a dielectric layer that has surface features created by a first photolithographic process. In FIG. 3B, a second photolithographic process is performed to provide for further surface featuring on the dielectric layer. In FIG. 3C, a barrier/seed layer is sputtered by physical vapor deposition (PVD). In FIG. 3D, a layer of copper is filled in the features through electrochemical plating (ECP). The layer of copper provide in FIG. 3D has an overburden, which is, along with the excessive barrier/seed layer, later removed by chemical-mechanical polishing (CMP) in FIG. 3E. The process may be repeated for successive redistribution layer (RDL) stack-up, as illustrated in FIG. 3F. As illustrated in FIG. 1, the repeated elimination of copper overburden by CMP has an adverse impact on the overall cost of this method. Nevertheless, the maximum routing/millimeter of this copper dual-damascene based RDL scheme is limited by resolution and depth of focus of the photolithography capability in accommodating uniformity of thick dielectric film, CMP planarization quality, and cleanliness condition during fabrication.

Figure 4:
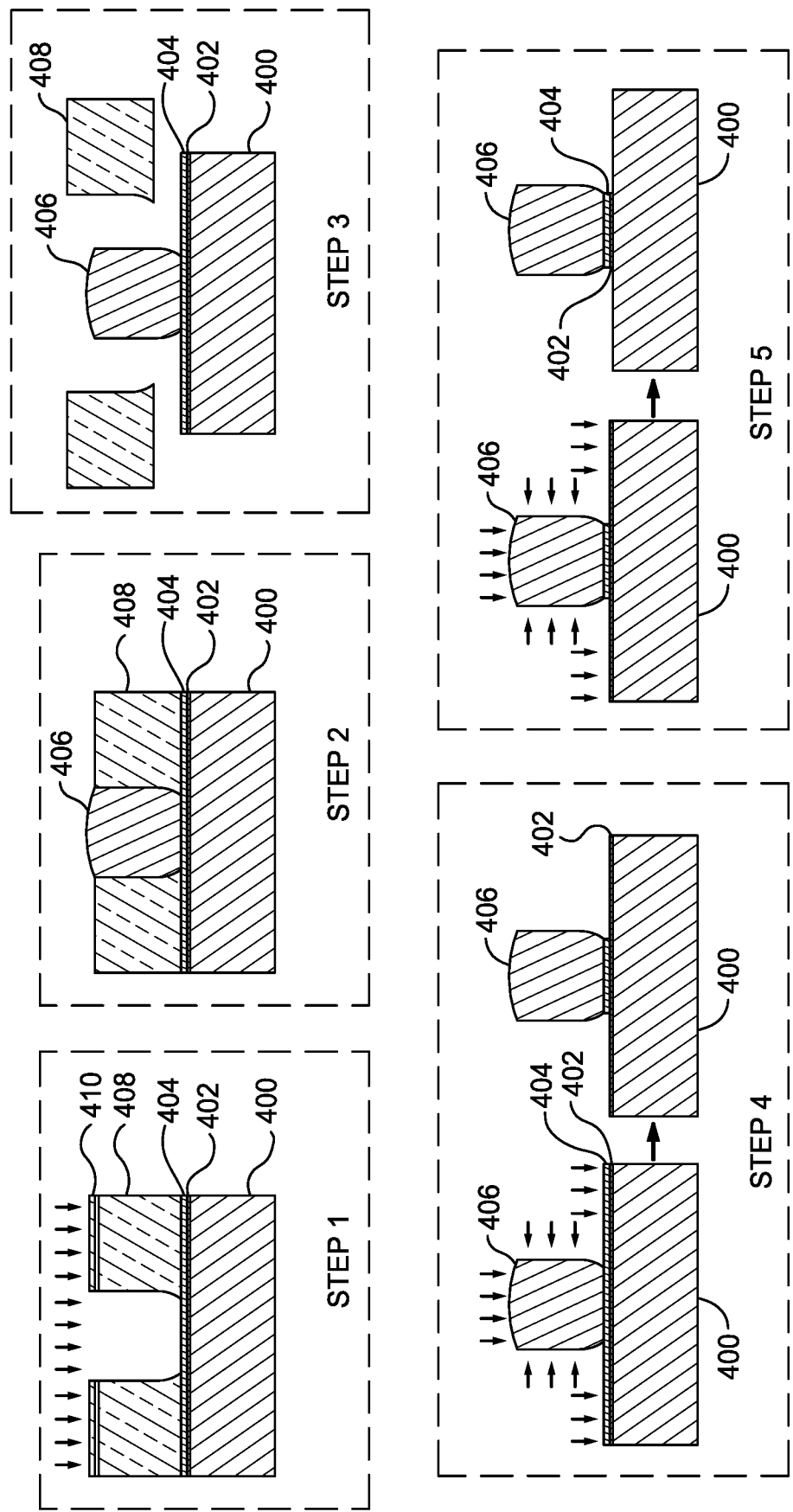
FIG. 4 provides for a method for creating a copper plating and seed layer etching using molybdenum in an adhesion layer.

Referring to FIG. 4, a method for using copper plating and using a seed layer with accompanying molybdenum adhesion layer over a dielectric layer (substrate) is provided. The molybdenum may be in the form of a molybdenum disulfide. The dielectric layer may be in a form of a spin-on, deposited or dry film or substrate and may include such materials as polyimide, epoxy, epoxy with fillers, Kaptrex, Apical, Kapton, UPILEX or other similar materials. In step 1, a dielectric layer 400 is provided as the substrate. To enable the remainder of the arrangement to adhere to the polyimide layer, an adhesion layer 402 is provided, wherein the adhesion has molybdenum. The adhesion layer 402 may be sputtered on to the top of the polyimide 400, as a non-limiting manner of providing the adhesion layer 402. A copper seed layer 404 is also provided over the adhesion layer 402. A surface layer of photoresist 408 is provided over the copper seed layer. The photoresist layer 408 may be patterned to a sufficient amount through a mask 410 to form a template for a desired pattern for electrical processing. The photoresist layer 408 may be a positive photoresist layer, such that when the resist is exposed to light, the sections experiencing the light become soluble to photoresist developer (as described later in step 3). Such patterning may be performed through photolithography, as a non-limiting embodiment. As will be understood, the photolithography may produce a simple configuration or may produce a significantly complex arrangement. In step 2, copper plating occurs, thereby filling the patterned surface of the arrangement, thus producing an arrangement, extending from bottom to top of: dielectric layer 400, adhesion layer 402, copper seed layer 404 and a layer of photoresist 408 and copper 406 on the copper seed layer 404. Step 2 can be performed through electrolysis by placement of the entire arrangement in a bath with a direct electric current to dissolve copper from a copper metal rod, thereby transporting copper ions from the rod through the bath to a cathode (the exposed area of the arrangement.

In step 3, the photoresist 408 is stripped from the top of the arrangement leaving the copper top and sides exposed along with the copper seed layer 404. In step 4, a wet etching is performed over the exposed copper tops and sides as well as the copper seed layer 404 to remove a surface layer of copper to expose the portion of the adhesion layer 402 not covered by the copper structure 406. Lastly, in step 5, a further wet etching is performed to remove the portion of the adhesion layer 402 not covered by the copper structure 406, resulting in a final product.

As described, the wet etching may use liquid-phase etchants. As an example embodiment, an arrangement may be immersed in a bath of an etchant. During the submersion, the liquid phase etchant may be stirred or agitated to perform an even etching over the required surface.

Figure 5A:
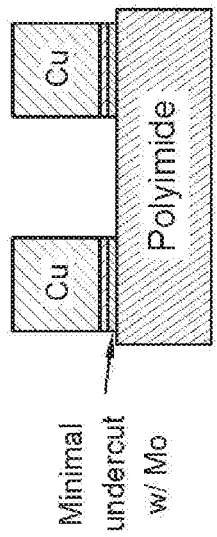
FIGS. 5A, 5B, 5C, 5D, 5E and 5F describe advantages and drawbacks of titanium and molybdenum adhesion layers.
Figure 5B:
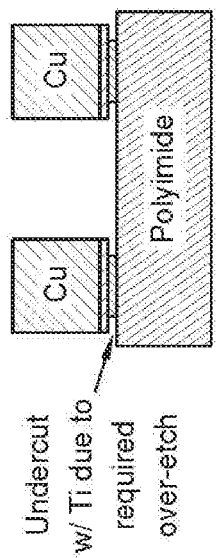
Figure 5C:
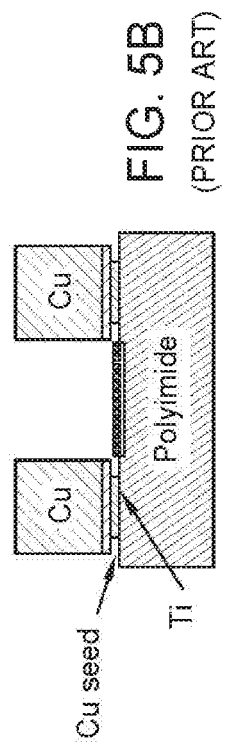
Figure 5D:
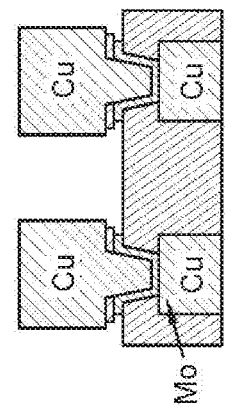
Figure 5E:
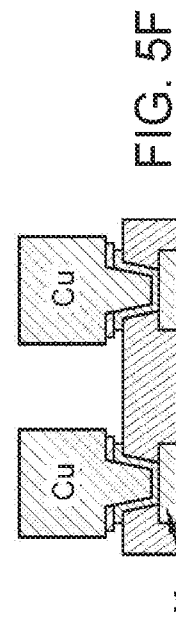
Figure 5F:
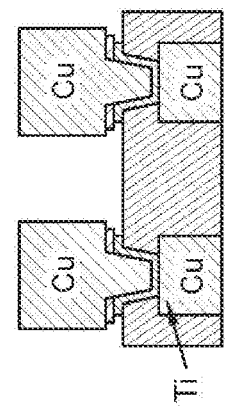

The method provided in FIG. 4, provides many advantages over conventional techniques as illustrated in FIGS. 5A-5F. Referring to FIGS. 5A-5F, with use of titanium in the adhesion layer, the removal of titanium, gets more and more difficult towards the interface with the dielectric layer. To this end, over-etching is required in FIG. 5A to ensure complete titanium adhesion layer removal as compared FIG. 5D, where an adhesion layer containing molybdenum can be easily removed without over-etching. Such over etching causes production results that are not in conformance with designed features. Referring to FIG. 5B, residual titanium on the dielectric surface leads to surface leakage current compared to FIG. 5E, where there is no metallic residue after barrier/seed etching when an adhesion layer containing molybdenum is used. Referring to FIG. 5C, the electrical resistivity value for titanium is 420 nΩ·m as compared to the electrical resistivity value for molybdenum of 53.4 nΩ·m in FIG. 5F. The intrinsically lower resistivity of molybdenum by one order of magnitude than that of titanium improves device electrical performance.

The method allows for resolutions to be achieved that were previously unattainable without the serious drawbacks of such conventional methods. The use of the molybdenum does not need over etching and hence minimizes undercut. Use of a conventional titanium layer requires a large over-etch for complete removal which causes an undercut underneath the copper structure, causing electrical and reliability issues of the package. Additionally, residual titanium to dielectric contact leads to surface leakage current minimizing the efficiency of the design. With molybdenum, no such surface leakage occurs. The use of a molybdenum layer also provides for a low resistance compared to titanium, thereby providing for a better electrical contact. The use of molybdenum also provides for superior warpage modulation, compared to titanium arrangements.

Aspects of the disclosure also allow for minimizing adhesion layer undercut. Such minimization of undercut allows sub-micron line/spacing and thicker barrier seed deposition to compensate for underlayer roughness. Such configurations enable semi-additive process on large substrates/panels.

In one non-limiting example embodiment of the disclosure, a method for producing an electrical component is disclosed comprising: providing a polyimide substrate; coating at least one side of the polyimide substrate with an adhesion layer comprising molybdenum; coating the adhesion layer with a copper seed layer; covering at least a portion of the copper seed layer with a coating of photoresist; removing a section of the coating of the photoresist to produce a surface feature; performing a copper plating process wherein the surface feature is filled with copper; removing the photoresist to produce a copper surface; performing a copper etching on the copper surface to produce copper etched surface and performing an adhesion layer etching on the copper etched surface.

In another example embodiment, the method may be performed wherein the copper etching is a wet copper etching.

In another example embodiment, the method may be performed wherein the removing the section of the coating of the photoresist is performed through a photoresist developer.

In another example embodiment, the method may be performed wherein the polyamide substrate is one of Kaptrex, Apical, Kapton and UPILEX.

In another example embodiment, the method may be performed, wherein the coating on at least one side of the polyimide substrate with an adhesion layer comprising molybdenum is performed by a sputtering process.

In another example embodiment, the method may be performed wherein the sputtering process is produced by a magnetron.

In another example embodiment, the method may be performed wherein the molybdenum is molybdenum disulfide.

In another example embodiment, a method for producing an electrical component is disclosed. In this method, the production includes providing a polyimide substrate with an adhesion layer containing molybdenum and a copper seed layer, covering at least a portion of the copper seed layer with a coating of photoresist, exposing the coating of photoresist, through a mask, to a radiation source, removing a section of the coating of the photoresist to produce a surface feature transferred from the mask, performing a copper plating process wherein the surface feature is filled with copper, removing the photoresist to produce a copper surface, performing a copper etching on the copper surface to produce copper etched surface and performing an adhesion layer etching on the copper etched surface.

In another example embodiment, the method may be performed wherein the copper etching is a wet copper etching.

In another example embodiment, the method may be performed wherein the removing the section of the coating of the photoresist is performed through a photoresist developer.

In another example embodiment, the method may be performed wherein the polyimide substrate is one of Kaptrex, Apical, Kapton and UPILEX.

In another example embodiment, the method may be performed wherein the coating on at least one side of the polyimide substrate with an adhesion layer comprising molybdenum is performed by a sputtering process.

In another example embodiment, the method may be performed wherein sputtering process is produced by a magnetron.

In another example embodiment, the method may be performed wherein the molybdenum is molybdenum disulfide.

In another example embodiment, the method may be performed, wherein the copper plating process is performed wherein the surface feature is filled with copper through electrolysis.

In another example embodiment, an arrangement is disclosed comprising: polyimide substrate with a first surface, a molybdenum adhesion layer connected to the first surface, a copper seed layer connected to the molybdenum adhesion layer; and a copper layer connected to the copper seed layer.

In another example embodiment, the arrangement may be configured wherein the seed layer is a copper seed layer.

In another example embodiment, the arrangement may be configured, wherein the copper layer has features that are at a line space packaging ratio of less than 10/10 μm.

In another example embodiment, the arrangement may be configured, wherein the copper layer has features that are at a line space packaging ratio of less than 5/5 µm.

In another example embodiment, the arrangement may be configured, wherein the copper layer has features that are at a line space packaging ratio of less than 2/2 µm.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A method for producing an electrical component, comprising:
   positioning an epoxy substrate;
   coating at least one side of the epoxy substrate with an adhesion layer comprising molybdenum, the adhesion layer comprising molybdenum being in direct contact with the epoxy substrate;
   coating the adhesion layer with a copper seed layer, the copper seed layer being in direct contact with the adhesion layer comprising molybdenum;
   covering at least a portion of the copper seed layer with a coating of photoresist;
   removing a section of the coating of the photoresist to produce a surface feature;
   performing a copper plating process wherein the surface feature is filled with copper;
   removing the photoresist to produce a copper surface that comprises the at least a portion of the copper seed layer that was coated with the photoresist and the copper formed during the copper plating process;
   after removing the photoresist, etching the copper surface to remove the at least a portion of the copper seed layer that was coated with the photoresist and leave at least a portion of the copper formed during the copper plating process; and
   etching the adhesion layer exposed after etching the copper surface, wherein the adhesion layer is etched to have a width substantially equal to a width of the surface feature adjacent thereto.

2. The method according to claim 1, wherein etching the copper surface comprises a wet copper etching.

3. The method according to claim 1, wherein the removing of the section of the coating of the photoresist is performed through a photoresist developer.

4. The method according to claim 1, wherein the epoxy substrate is an epoxy film.

5. The method according to claim 1, wherein the coating on the at least one side of the epoxy substrate with an adhesion layer comprising molybdenum is performed by a sputtering process.

6. The method according to claim 5, wherein the sputtering process is produced by a magnetron.

7. The method according to claim 1, wherein the molybdenum is molybdenum disulfide.

8. A method for producing an electrical component, comprising:
   positioning an epoxy substrate with an adhesion layer containing molybdenum disposed directly on the epoxy substrate and a copper seed layer disposed directly on the adhesion layer;
   covering at least a portion of the copper seed layer with a coating of photoresist;
   exposing the coating of photoresist, through a mask, to a radiation source;
   removing a section of the coating of the photoresist to produce a surface feature transferred from the mask;
   performing a copper plating process wherein the surface feature is filled with copper;
   removing the photoresist to produce a copper surface that comprises the at least a portion of the copper seed layer that was coated with the photoresist and the copper formed during the copper plating process;
   after removing the photoresist, etching the copper surface to remove the at least a portion of the copper seed layer that was coated with the photoresist and leave at least a portion of the copper formed during the copper plating process; and
   etching the adhesion layer exposed after etching the copper surface, wherein the adhesion layer is etched to have a width substantially equal to a width of the surface feature adjacent thereto.

9. The method according to claim 8, wherein etching the copper surface comprises a wet copper etching.

10. The method according to claim 8, wherein the removing of the section of the coating of the photoresist is performed through a photoresist developer.

11. The method according to claim 8, wherein the epoxy substrate is an epoxy film.

12. The method according to claim 8, wherein the coating on at least one side of the epoxy substrate with an adhesion layer comprising molybdenum is performed by a sputtering process.

13. The method according to claim 12, wherein the sputtering process is produced by a magnetron.

14. The method according to claim 8, wherein the molybdenum is molybdenum disulfide.

15. A method for producing an electrical component, comprising:
   coating a first surface of an epoxy substrate with an adhesion layer comprising molybdenum, the adhesion layer comprising molybdenum being in direct contact with the first surface of the epoxy substrate;
   coating the adhesion layer with a copper seed layer, the copper seed layer being in direct contact with the adhesion layer comprising molybdenum;
   covering at least a portion of the copper seed layer with a coating of photoresist;
   removing a section of the coating of the photoresist to produce a surface feature;
   performing a copper plating process wherein the surface feature is filled with copper;
   removing the photoresist to produce a copper surface that comprises the at least a portion of the copper seed layer that was coated with the photoresist and the copper formed during the copper plating process;
   after removing the photoresist, etching the copper surface to remove the at least a portion of the copper seed layer that was coated with the photoresist and leave at least a portion of the copper formed during the copper plating process; and
   etching an exposed surface of the adhesion layer after etching the copper surface to expose the first surface of the epoxy substrate, wherein the adhesion layer is etched to have a width substantially equal to a width of the surface feature adjacent thereto.

16. The method of claim 15, wherein the molybdenum is molybdenum disulfide.

17. The method of claim 15, wherein etching the copper surface comprises a wet copper etching.

18. The method of claim 15, wherein the coating of the first surface of the epoxy substrate with an adhesion layer comprising molybdenum is performed by a sputtering process produced by a magnetron.

* * * * *